United States Patent [19]
Berezin et al.

[11] Patent Number: 5,539,752
[45] Date of Patent: Jul. 23, 1996

[54] METHOD AND SYSTEM FOR AUTOMATED ANALYSIS OF SEMICONDUCTOR DEFECT DATA

[75] Inventors: Alan Berezin; Reuben Quintanilla, both of Austin, Tex.

[73] Assignee: Advanced Micro Devices, Inc., Sunnyvale, Calif.

[21] Appl. No.: 496,871

[22] Filed: Jun. 30, 1995

[51] Int. Cl.$^6$ ................................................. H04B 17/00
[52] U.S. Cl. ........................ 371/22.1; 364/490; 364/577
[58] Field of Search .................................. 371/22.1, 22.2, 371/15.1, 72; 364/577, 578, 489, 490; 324/153 R; 365/201

[56] References Cited

U.S. PATENT DOCUMENTS

| | | |
|---|---|---|
| 3,751,647 | 8/1993 | Maeder et al. . |
| 4,579,455 | 4/1986 | Levy et al. . |
| 5,111,404 | 5/1992 | Kotami .................................. 364/468 |
| 5,274,434 | 12/1993 | Morioka et al. . |
| 5,317,380 | 5/1994 | Allemand . |
| 5,430,734 | 7/1995 | Gilson .................................. 371/22.2 |
| 5,440,649 | 8/1995 | Kiyasu et al. ........................ 382/187 |

*Primary Examiner*—Vincent P. Canney
*Attorney, Agent, or Firm*—Haynes and Boone

[57] ABSTRACT

Method and a system for performing semiconductor manufacturing defect analysis in cooperation with wafer scanning tools. The system analyzes data associated with defects on a substrate. First, a subset of defects is selected from subpopulations of the defects according to preclassify rules, such that classification codes indicative of defect type may then be assigned to the selected defects based upon review thereof. Classification codes indicative of defect type are then randomly assigned to a number of unselected ones of the defects in each of the subpopulations, the number, for each defect type, being weighted according to the expected occurence of the defect type extrapolated from the selected defects of the same defect type.

38 Claims, 4 Drawing Sheets

METHOD AND SYSTEM FOR AUTOMATED ANALYSIS OF SEMICONDUCTOR DEFECT DATA

TECHNICAL FIELD

The invention relates generally to the manufacture of semiconductor integrated circuit ("IC") chips and, more particularly, to a method and system for performing in-line spacial map analysis of semiconductor wafer defects that involves the preclassification, review, and extrapolation of defect data and the testing of such data for excessive defects.

BACKGROUND OF THE INVENTION

Semiconductor integrated circuits (ICs) are fabricated by an extremely complex process that involves several hundred or more operations. They are fabricated by selectively implanting impurities into, and applying conductive and insulative layers onto, a semiconductor substrate. Semiconductor ICs (i.e., "chips") are not manufactured individually, but rather as an assembly of a hundred or more chips on a "wafer," which is then diced up to produce the individual chips.

Increasing production yield is an ongoing problem in the manufacture of semiconductor chips. Because of various defects that can occur in fabrication of a wafer, significant numbers of wafer die have to be discarded for one reason or another, thereby decreasing the percentage yield per wafer and driving up the cost of individual chips. Defects are typically caused by foreign particles, minute scratches and other imperfections introduced during photoresist, photomask and diffusion operations. Yield impacts the number of wafer starts at the inception of production needed to meet specific customer order quantities for finished chips at the end of the production line. With the high demand for semiconductor chips and more orders than can possibly be filled by a fabrication facility, predicting yield to accurately gauge wafer starts, and utilizing defect information to remove yield detracting operations, are important aspects of improving the efficiency, and hence output, of the fabrication facility.

Wafer scanning tools are utilized to identify defects that occur in the chip manufacturing process for the aforementioned purposes. Typically, such tools are located at a variety of positions along the production line and comprise automated-vision inspection stations for identifying visual irregularities in the wafer die as they move through the line. The irregularities, i.e., defects, are recorded according to their coordinates, estimate of size or other parameters and are stored as records in a database. The records represent raw information that must then be analyzed or otherwise processed off line to determine the impact, if any, of the identified defects on product yield. Some defects, for example, do not adversely affect yield as much as others, and therefore must be classified differently for analysis purposes.

Commercially available wafer scanning tools include those made by KLA Instruments Corporation of Santa Clara, Calif., Tencor Instruments Corporation of Mountain View, Calif., Inspex, Inc. of Billerica, Mass. and numerous other manufacturers. Despite significant advances made in wafer scanning technology, the various tools that are available suffer striking deficiencies. In particular, such tools lack the capability to perform certain advanced classification and analysis of defect information necessary to accurately determine the true impact of wafer defects on yield. While conventional tools offer simple data presentation capabilities, such as the display of wafer maps, histograms and charts, they do not adequately classify or process the defect data. Classification codes typically must be manually entered into wafer scan records indicating the type of defect and its potential impact on yield. This is done by placing the wafer on a review station where a user makes a judgment as to what the defect identified by the scan tool is, enters a classification code in the record for that defect, then proceeds to the next defect.

More sophisticated tools perform limited automatic classification of defect records according to the location of the defect on the wafer, in an effort to remove consideration of defects that do not require any classification. For example, it is recognized that a number of defect points in close proximity to one another, collectively referred to as a "cluster," can indicate a single event such as a contaminant or scratch present across one or more die. The sometimes thousands of defect points comprising a cluster therefore inordinately skew the data, representing "noise" that should be treated as a smaller number of defects for yield determination purposes. Therefore, some tools include the ability to automatically "decluster" the defect data, i.e., convert a cluster containing potentially many defect points to a single or smaller number of defects. Unfortunately, however, decluster algorithms typically used with known tools tend to be specific to a particular scan tool and are not readily adaptable for use with other tools.

Another disadvantage suffered by scanning tools is that they do not adequately perform other types of automatic classification or yield prediction operations beneficial in a manufacturing defect analysis, thereby limiting the utility thereof. For example, in addition to the declustering of defect data, it is often desirable to further refine the defect data before manual inspection and classification of individual defects on the review station. Since each wafer can include so many defects it would not be practical to manually review and classify each of them, it would be desirable to utilize a method to randomly choose a statistically meaningful sample, i.e., subset, of such defects for consideration.

Historically, the review station operator randomly picks sets of defects that seem interesting and then reviews and classifies them. However, it is difficult for humans to systematically choose defects for this purpose that will be representative of all of the defects on the wafer. Some review stations are equipped with the ability to randomly move to different defects which the operator can then review and classify. A problem though with conventional randomizing methods performed on review stations is that they are not necessarily accurate in representing a true sampling of the wafer. For example, picking defects at random tends to result in the inordinate picking of defects that are part of a big cluster, because there are more of them, while defects of other types and in other locations on the wafer are overlooked. Therefore, it would be desirable to adopt an automated, consistent method for randomly identifying for review, i.e., "preclassifying," defects of interest. The methodology used to randomly identify, i.e., preclassify, defects preferably would focus on defect subpopulations defined in terms of defect size ranges, or alternatively in terms of locations on the wafer, so that the sample of defects chosen best reflects conditions actually occuring on the wafer.

Once defects of interest are randomly preclassified according to a beneficial methodology, they can then be manually reviewed and assigned appropriate classification codes by an operator to indicate defect type, e.g., big cluster, small cluster, or the like. Some equipment is available that automatically assigns such classification codes to defect types based upon machine visual attributes.

After defects are randomly chosen (i.e., preclassified), and then reviewed to assign classification codes thereto, the next task of interest is how to use the sample to estimate what the classification codes should be for the remaining defects on the wafer. The classification codes for the entire wafer should be extrapolated from the sample defect data consistent with the preclassification methodology used earlier to sample the subpopulations of defects. Finally, the estimated, i.e., extrapolated, defect data with classification code estimates for all defects, can be analyzed to provide warnings during manufacturing of certain adverse conditions.

Unfortunately, known defect analysis systems do not contemplate preclassification, review and extrapolation methodologies of the foregoing type for accurately and efficiently analyzing semiconductor defect data. Instead, known systems tend to rely simplistic, line of regression analyses, or other statistical correlations of defects to yield for a given lot or given wafer. More sophisticated systems are deficient in accounting for spacially inhomogeneous distributions of defect types and in extrapolating defect type information of the entire population from a small sample of reviewed defects.

Consequently, there is a need for a method and system that permits more accurate defect analysis to be performed in cooperation with semiconductor wafer scanning tools.

Particularly, there is a need for a method and system that performs an automatic preclassification of defect data based upon consideration of defects occuring in different defect subpopulations, rather than by simple randomization of defects, to identify a statistically meaningful sample of defects to be analyzed.

There is further a need for a method and system that performs extrapolation of sampled defect data in a way that assigns classification codes to unreviewed defects consistent with the preclassification scheme used to identify defects in different defect subpopulations.

SUMMARY OF THE INVENTION

The present invention, accordingly, provides a method and a system for performing semiconductor manufacturing defect analysis in cooperation with wafer scanning tools that overcome or reduce disadvantages and limitations associated with prior methods and systems, particularly with respect to the preclassification, review and extrapolation of defect data.

The present invention preclassifies defects chosen at random from wafer subpopulations and then extrapolates the defect data to represent defect information for all defects in the subpopulations. Subsequent analysis provides warnings where, for example, defect density, or number of defects per die, exceed preselected parameters.

In one aspect the invention analyzes data associated with defects on a substrate. First, a subset of defects is selected from subpopulations of the defects according to preclassify rules, such that classification codes indicative of defect type may then be assigned to the selected defects based upon review thereof. Classification codes indicative of defect type are then randomly assigned to a number of unselected ones of the defects in each of the subpopulations, the number, for each defect type, being weighted according to the expected occurence of the defect type extrapolated from the selected defects of the same defect type.

In another aspect, the code-assigned defects are tested for excessive defects of specified defect type. The presence of the excessive defects may be indicated on a computer display, for example. In a preferred embodiment, excessive defects of specified defect type exist when the number of die of a wafer substrate rendered inoperative by the specified defect type exceeds a predetermined number, or alternatively, when the defect density of specified defect type exceeds a predetermined number.

In a preferred embodiment the invention is implemented as computer programs stored on computer-readable media. The programs are run on a system compatible with a commercially available wafer scanning tool or on the scanning tool itself.

A technical advantage achieved with the invention is that the preclassify program automates the identification, i.e., preclassification, of defects to be manually reviewed and classified. The methodology used to preclassify defects is performed by the program more easily and with greater consistency than would be possible if attempted manually.

Another technical advantage achieved is that by sampling defects from defined subpopulations on the wafer, the preclassify program samples defects in a way that more accurately accounts for spacially inhomogeneous distributions of defect types on the wafer.

Yet another technical advantage achieved is that by extrapolating the sampled defects according to the preclassify methodology used to select them, a more accurate expected occurence is realized for all defects on the wafer, specific to defect subpopulations of interest.

Another technical advantage achieved is the provision of real-time analysis of defects as compared with off-line analysis, thereby allowing faster response to fabrication problems at any given step in the manufacturing line. Warnings can be initiated by the system for identifying yield detracting operations that occur between fabrication steps.

DESCRIPTION OF THE PREFERRED EMBODIMENTS

Figure 1:
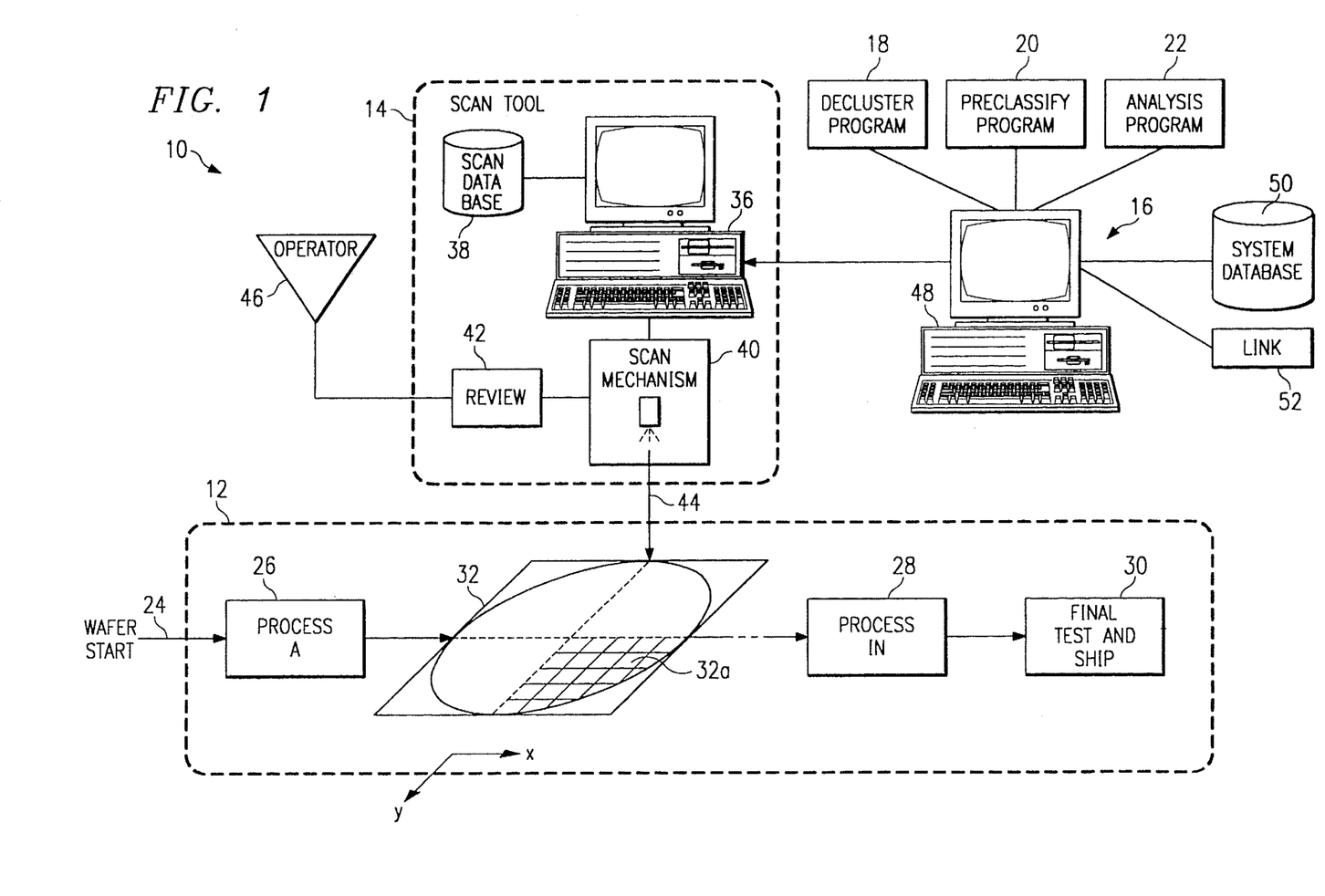
FIG. 1 is a schematic block diagram of a defect analysis system of the present invention for use with a wafer scanning tool in a semiconductor fabrication

In FIG. 1, the reference numeral 10 refers to an environment that is a portion of a semiconductor wafer fabrication facility ("wafer fab") for practicing the preferred embodiment of the invention. The environment 10 includes a manufacturing line 12 for fabricating semiconductor integrated circuit (IC) products. A scan tool 14 is located at various stages of the line 12 for visually inspecting wafers comprising the ICs as they are being manufactured. A defect analysis system 16 is operatively coupled to the tool 14 for performing defect analysis operations of the preferred embodiment, as discussed more fully below.

Operatively coupled to the system 16 are several computer program utilities. Generally, a decluster program 18 performs defect data decluster functions in a first level of refinement of the defect data generated by the scan tool 14. A preclassify program 20 separately performs defect data preclassification functions for identifying statistically meaningful sets of sample defect data. The preclassified defect data is subsequently reviewed by an operator for purposes of assigning defect classification codes to the data. An analysis program 22 then extrapolates the defect data to estimate what the classification codes should be for the remaining, unclassified defects on the wafer. The extrapolated defect data is used to produce warnings of when the number of defects of a certain defect type for a given die exceed a threshold value, or when the defect density of a certain defect type exceeds a threshold value, thereby indicating yield-detracting operations of the manufacturing process. The programs 18, 20 and 22 are described fully below.

In the environment 10, semiconductor wafers are started in the manufacturing process, as indicated at line 24. The wafers are grouped and started in multiples, referred to as "lots", upon which a sequence of individual process operations are then performed. Process step A is first performed on a wafer lot as indicated by block 26. Subsequently, additional process steps are performed. Each process step, for example, comprises operations to be performed for a particular mask or layer of the wafers in the lot. Since the process steps are conventional and vary depending on the integrated circuit (IC) product being manufactured, they are not described in further detail. Block 28 represents completion of a sequence of many (up to N) processes, it being understood that in the typical wafer fab over one thousand processes, averaging up to a hundred or more steps each, must be completed. Upon completion, at block 30 the ICs comprising the wafers are ready for final test and shipment.

Following completion of Process A in block 26, the wafer scan tool 14 is used to perform a visual inspection of at least representative samples of the partially fabricated ICs in the wafer lot, as is represented by a wafer 32 located in proximity to the tool 14. While not shown, it is understood that similar inspections are performed at various stages of manufacturing of the wafer 32 and numerous tools 14 may be required to perform the inspections. Generally, the visual inspection performed by the scan tool 14 is used to identify defects of particular types to be used in an analysis of the effect of each defect type on the yield of the lot, or on the yield of individual wafers or wafer die in the lot. Engineering analysis of the process steps associated with particular defects may then be performed to identify and correct yield detracting operations.

The scan tool 14 comprises commercially available components and includes a computer 36, a database 38, a scan mechanism 40 and a review station 42. In a preferred embodiment, for example, the tool 14 is a KLA 21(xx) series defect scanning tool available from KLA Instruments Corporation. The scan mechanism 40 includes a microscope or other device for inspecting particles or other defects on the surface of the wafer 32. The wafer 32 may be moved relative to scan mechanism 40 by a transport mechanism (not shown) in the x and y directions perpendicular to the scan mechanism 40 to cause the microscope to sweep over the surface of the wafer in a series of adjacent, possibly overlapping, scan lines. Each wafer die, such as a die 32a, is scanned and the information derived therefrom is converted to digital form and processed by the computer 36. In operation the scan mechanism 40 compares one die of the wafer 32 to the next. Presumably, every die will be identical to the next and any differences indicate an error, i.e., a defect. As will be described further with reference to FIG. 2, the computer 36 constructs files comprising records of scanned defects that are then stored in the database 38. Each record includes information concerning the x-location and y-location of the defect, and an estimation of the x-size and y-size of the defect. Other fields of the records include, but are not necessarily limited to, classification codes for the defects.

The review station 42 is used by an operator 46 to manually study defects scanned by the mechanism 40. In a typical conventional application, the operator 46 must study the defects and either enter or modify classification codes into the stored records for the defects on the computer 36.

The tool 14 is capable of generating on its display various graphics indicative of scanned defects. These include histograms, wafer maps, charts or the like. The tool 14 is further capable of assembling files of defect records stored in the database 38 which may then be used to various perform defect analyses. As explained in detail below, the decluster utility 18 and the preclassify utility 20 are utilized in cooperation with the tool 14 to modify defect records in improvement of subsequent analyses.

The defect analysis system 16 includes a computer 48, a system database 50 and a link 52. The link 52 operatively connects the system 16 to other control systems or computers (not shown) within the fab. In the preferred embodiment, the computer 48 is a commercially available PC or workstation running a Microsoft Windows operating system. Preferably, the system 16 is designed to read defect and sort files in the KLA Results File format, available from KLA Instruments Corporation, and also the TLV format, available from Inspex, Inc. The programs 18, 20, 22 are stored in the system 16 as one or more programs for operation on the computer 48 and are preferably written in C++ programming language.

Figure 2:
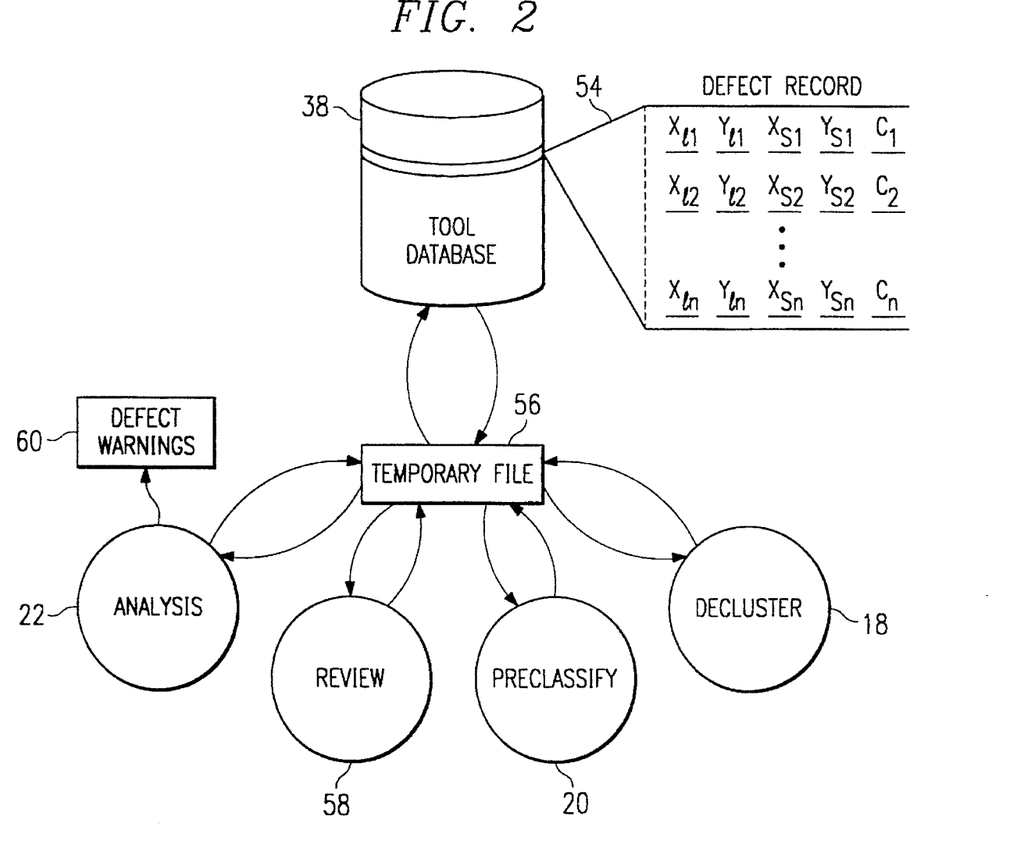
FIG. 2 is a conceptual block diagram of the sequence of operations performed on the defect data by the system of FIG. 1.

FIG. 2 illustrates a general process flow of the sequence of functions performed on defect data in the preferred embodiment of the invention. Referring to both FIGS. 1 and 2, the database 38 of the scan tool 14 is used to store wafer defect data in the form of "records." Shown schematically in FIG. 2 is the data structure of one such record 54 that contains data pertaining to the defects detected on the wafer 32. While not shown, it is understood that multiple records are stored in the database 38, each relating to wafer defects at different reticle layers of wafers in one or more lots. It is appreciated the records are organized into computer files by the computer 36 according to lot, layer and wafer designations, for example.

The record 54 comprises information concerning all of the defects (1 through n) detected on the wafer 32, including the x-location $(X_l)$ and y-location $(Y_l)$ of each defect, and an estimation of the x-size $(X_s)$ and y-size $(Y_s)$ of the defect. Another field of the record 54 is classification codes (C) for the defects. The classification codes indicate the nature of the defect and can be used to evaluate whether a defect is critical, i.e., whether it impacts the functionality of the IC. For example, classification codes might classify defects in terms of whether a defect is one that cuts a circuit line, or touches two lines, or whether it is above a particular layer or beneath a particular layer. The classification codes also might classify defects in terms of defect size, i.e., whether it is part of a big cluster or small cluster, or in terms of whether the defect is "discardable" in that it does not represent additional meaningful information for the defect analysis. Other criteria for classification codes are readily understood by those skilled in the art and therefore are not discussed further.

The classification codes for defects in the record 54 are used to make estimates concerning what impact, if any, a particular defect type will have on die or wafer yield. Once the wafer 32 is scanned and the defects are identified in the record 54 in terms of their location data ($X_l$, $Y_l$) and size data ($X_s$, $Y_s$), the normal procedure is then for an operator 46 to review the defects and manually enter the classification codes for each defect into the record 54. This is done by placing the wafer 32 on the review station 42 that includes a microscope (not shown) designed to automatically locate itself to the sites of the defects. The operator 46, based upon judgments about what the defect is, can classify it and then modify the record 54 to include the appropriate classification code.

Wafers can include hundreds of thousands of defects and it is a very time consuming task to manually enter classification codes for each of them in the record 54. Also, some defects do not contribute meaningfully to the data where they all relate to the same cluster of defects, such as scratch. Therefore, before manual review and classification of defects is performed by the operator 46, the decluster program 18, and/or the preclassify program 20, operate to automatically assign certain classification codes to selected defects in the record 54, as described below.

From the database 38, the computer 36 writes out a temporary file 56 that contains the records for a particular lot, such as a lot containing the wafer 32 and its corresponding record 54. The temporary file 56 is stored in the computer 48 of the analysis system 16. The decluster program 18, running on the computer 48, reads the file 56 and declusters the defect data by entering classification codes into the record 54 to indicate a defect is either part of a cluster or is discardable. In particular, some defects are assigned a classification code indicating they are part of a cluster, i.e., defects in close proximity to one another on the wafer 32, and other defects of the same cluster are assigned a code that indicates them to be "discardable." The discardable defects therefore can be removed from consideration in later classification and yield determining procedures. This procedure is referred to as "declustering" the defect data. The decluster program 18 is implemented using any available decluster algorithm and therefore will not be described in further detail.

Once the decluster operation is performed by the decluster program 18, the preclassify program 20 reads the file 56 and further refines the defect data by changing classification codes in the defect records to indicate a random sample of defects which are to be reviewed at the review station 42. The random sample is chosen according to a set of randomizing rules in which defects are chosen from defined subpopulations of defect data, as will be described below. At the review station 42 the chosen sample of defects is classified by defect type. In this manner, a subset of defect records is created that may be used to extrapolate the defect types for all of the defects on the wafer 32.

The details of how the preclassify program 20 determines which defects are to form the preclassify sample are described fully below. The preclassify program 20 may be implemented by, for example, activating a command on the computer 48 whereupon the preclassification functions are then automatically applied to the defect data. It is understood that the preclassify program 20 is transportable across all scan tools 14 that provide defect coordinates with defect size. Further, it is understood the preclassify program 20 may be implemented with or without having first declustered the defect data using the decluster program 18.

After the preclassify program 20 completes its operations, the computer 36 of the scan tool 14 reads the temporary file so that at the review station 42, only the defects that were identified as preclassify defects will show up for review. Icon 58 (FIG. 2) indicates the performance of such a review on the review station 42 following refinement of the data by the preclassify program 20. The operator 46 performs the manual review of the wafer and enters defect type classification codes for the identified sample of defects. Since the sample of defects is relatively small compared to all of the defects on the wafer, e.g., approximately 50 defects, the manual review and classification procedure is not overly burdensome.

With the classification codes thus "re-coded" by the operator 46 on the review station 42, the modified file 56 may then be acted upon by the analysis program 22. As will be explained fully below, the analysis program 22 reads the defect file and retrieves the preclassify rules for the particular layer of defects being considered. Using this information, the analysis program 22 then estimates what the classification codes should be for the remaining, unclassified defects on the wafer, extrapolated from the small number of already classified defects. The estimated defect data is returned as a modified file 56, typically to a different file directory of the tool 14, and converted to appropriate entries in the database 38.

The analysis program 22 further includes logic for producing warnings on a display 60 to indicate the existence of yield detracting defects, as determined from the extrapolated defect data. The display 60 is understood to be either the display of the system 16, the display on the tool 14, or some other display. The warnings are produced when the number of die killed by a certain defect type exceeds a threshold value, or when the defect density of a certain defect type exceeds a threshold value.

Figure 3:
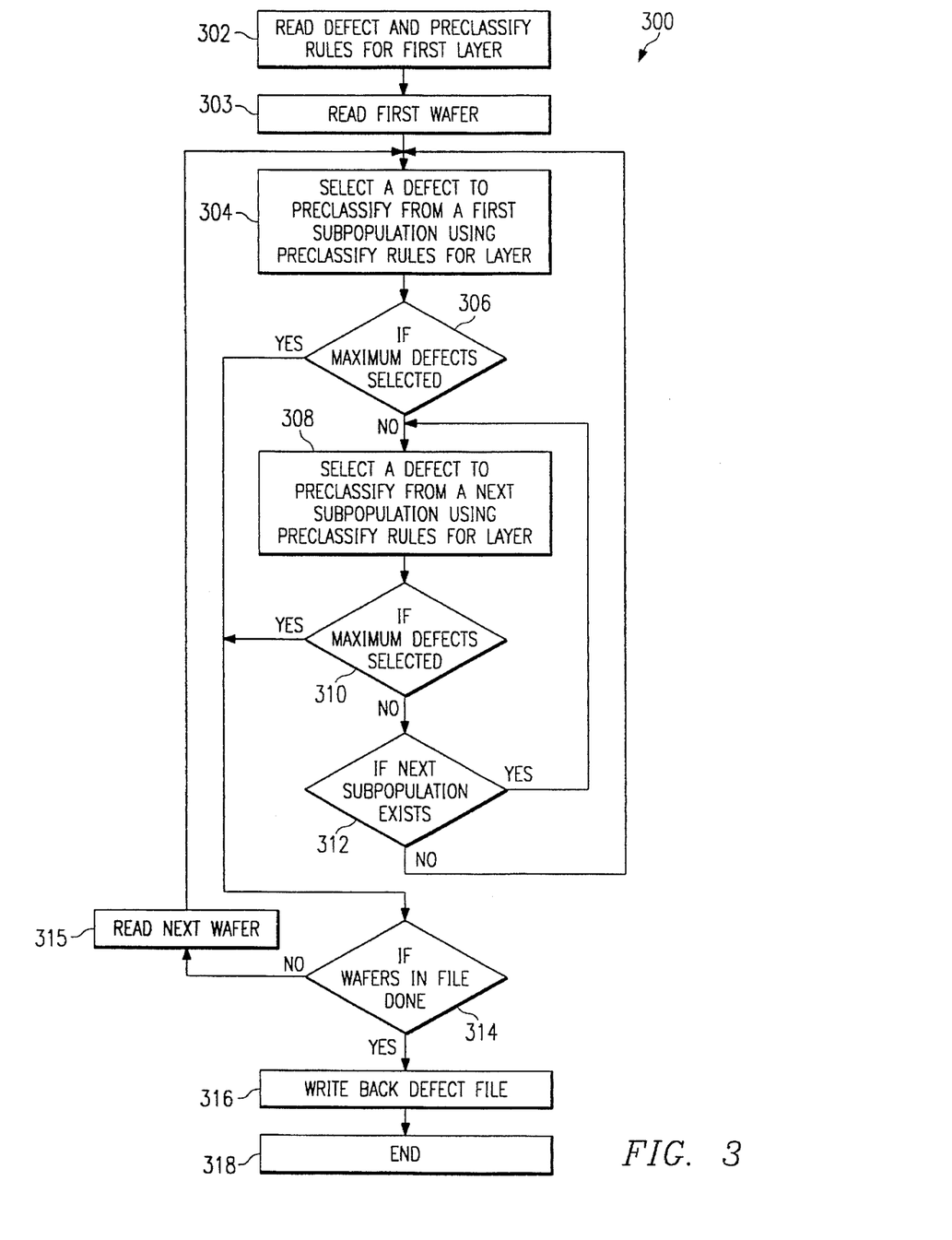
FIG. 3 is a process control flow diagram of the preclassify program of the system of FIG. 1.

FIG. 3 is a process control flow diagram 300 of the preclassify program 20. The preclassify functions performed by the program 20 are run on a defect lot file such as the temporary file 56. The functions are specific to each production layer and are separately performed for all layers of interest.

Preclassify rules, as described below, are predefined for each layer and then automatically applied when the program 20 is executed to preclassify defects for that layer of the lot file. A layer identifier in the file 56 indicates the particular layer and hence the particular preclassify rules to be executed for that layer. Execution of the program 20 occurs independently for each layer of interest until execution for all layers have been completed.

In step 302 a defect file containing defect records for a fabrication layer of interest of a wafer lot is read into the computer 48 of the system 16. Similarly, an initialization file is read that contains preclassify rules, i.e., parameters, for the layer of interest.

It is understood that prior to execution of the preclassify program 20, the preclassify rules, i.e., parameters, to be applied for each layer of interest are defined. The following parameters are initially set up for each layer: (1) the total number of defects to be reviewed, i.e., preclassified; (2) the code with which chosen defects are to be classified; (3) the defect type(s) which may be chosen; (4) the subpopulations (e.g., defect size ranges or defect locations) in which defects are to be randomly chosen; and (5) the randomizing function to be used to randomly choose defects within the subpopulations.

In the preferred embodiment, an initialization file is written for each lot defect layer specifying the foregoing parameters. Shown below is an example initialization file \DKT.INI illustrating the syntax of the preferred embodiment, with characters to the right of an asterisk ("*") being read as comments.

```
\ DKT.INI *

BeginClassifyScheme      *This token begins the syntax of the rules
MaxDefects=30%           *Preclassify 30% of all defects
MaxDefects=50            *But only up to a max of 50 defects
PreClassifyCode=255      *Change defect type code to 255 for
                         *preclassified defects
PreClassify Type=        *Only choose from among defect types
0, 34                    *0 or 34
RandomDie=[2, 4]         *The first subpopulation is 2-4 μm sized
                         *defects. Use the RandomDie
                         *randomization function to choose defects
                         *in this subpopulation
RandomDie=[4, 6]         *The second subpopulation is 4-6 μm
                         *sized defects. Use the RandomDie
                         *randomization function to choose defects
                         *in this subpopulation
RandomDefect=[6, *]      *The third subpopulation is 6 μm and
                         *greater sized defects. Use the
                         *RandomDefect randomization function to
                         *choose defects in this subpopulation
EndClassify Scheme       *This ends the rules
*
```

The number of defects to be chosen (MaxDefects) can be expressed as a total number, a percentage of defects on a wafer, or a combination thereof. Any number can be chosen so long as it represents a statistically meaningful sample of defects. The preclassify types ("PreClassifyType") from which defects can be selected are defects that have not been classified at all ("0") or small clusters ("34") in the present embodiment, although any number or any type of defect may be specified as a preclassify type. Three subpopulations ("[2, 4]", "[4, 6]" and "[6, *]") are specified above. The subpopulations represent three different defect size ranges, although it is understood that any number of subpopulations of different defect size ranges are contemplated. Further, the subpopulations can alternatively define, instead of size ranges, defect locations expressed, for example, as boxes, quadrants, radial zones or the like.

The choice of the randomizing function ("RandomDie" or "RandomDefect") determines how the defects are randomly chosen from all of the defects in the subpopulation. The RandomDefect function means to randomly select any defect in the subpopulation. In contrast, the RandomDie function means to first select a die at random from amongst all die that have a defect or defects that are in the subpopulation, and then to select a defect at random from within that selected die. The advantage of using the RandomDie function is that it offers a better chance of selecting meaningful defects that might exist in less populated die, as opposed to statistically concentrating on defects in areas of high defect density.

In step 303 the defect records for a first wafer, pertaining to the layer of interest, are read. In step 304 a defect is selected from the records and given a "preclassify" code. The defect is selected from from the first subpopulation defined by the preclassify rules. The manner in which the defect is selected depends upon the randomizing function specified in the rules for that subpopulation. For example, if the RandomDefect function is specified, the defect is randomly selected from all of the defects in the subpopulation that meet the specified preclassify type. If instead the RandomDie function is specified, the defect is randomly chosen by first randomly selecting a die within the subpopulation that includes at least one defect of the specified preclassify type, and then from the selected die, selecting a defect of the specified preclassify type.

It is understood that if in step 304 no defect can be selected because there are no defects in the subpopulation that meet the specified preclassify type, then execution proceeds to the next step without making a selection.

In step 306 a decision is made whether the maximum number of defects specified in the preclassify rules have already been selected. If so, execution proceeds to step 314 where the defect file is written back to its source. If in step 306 the maximum number of defects has not been selected, execution continues to step 308. As indicated above, the maximum number of defects can be expressed as a number or a percentage of defects on a wafer and the only requirement is that it represent a statistically meaningful sample.

In step 308 a defect is selected and preclassified, taken from the next subpopulation defined by the preclassify rules. The manner in which the defect is selected depends upon the randomizing function specified in the rules for that subpopulation, as described above.

In step 310 a decision is made whether the maximum number of defects have been selected yet, and if so, execution proceeds to step 314. If the maximum number have not been selected, in step 312 a decision is made whether a next subpopulation exists, as defined in the preclassify rules. If so, execution returns to step 308 and the process of selecting and preclassifying is repeated for that subpopulation. If in step 312 there is no next subpopulation defined in the preclassify rules, execution returns to step 304 and the process of selecting and preclassifying begins again with the first subpopulation.

The processing loops of step 312 thus repeat until the maximum number of defects have been selected by the preclassify program 200. In step 314 a determination is made whether all of the wafers in the defect file have been processed. If not, in step 315 the next wafer is read and execution returns to step 304. If in step 314 all of the wafers have been considered, in step 316 the defect file is written back to a specified memory location. In step 318 execution ends. It is understood the process may be repeated for different layers according to the preclassify rules for that layer.

Figure 4:
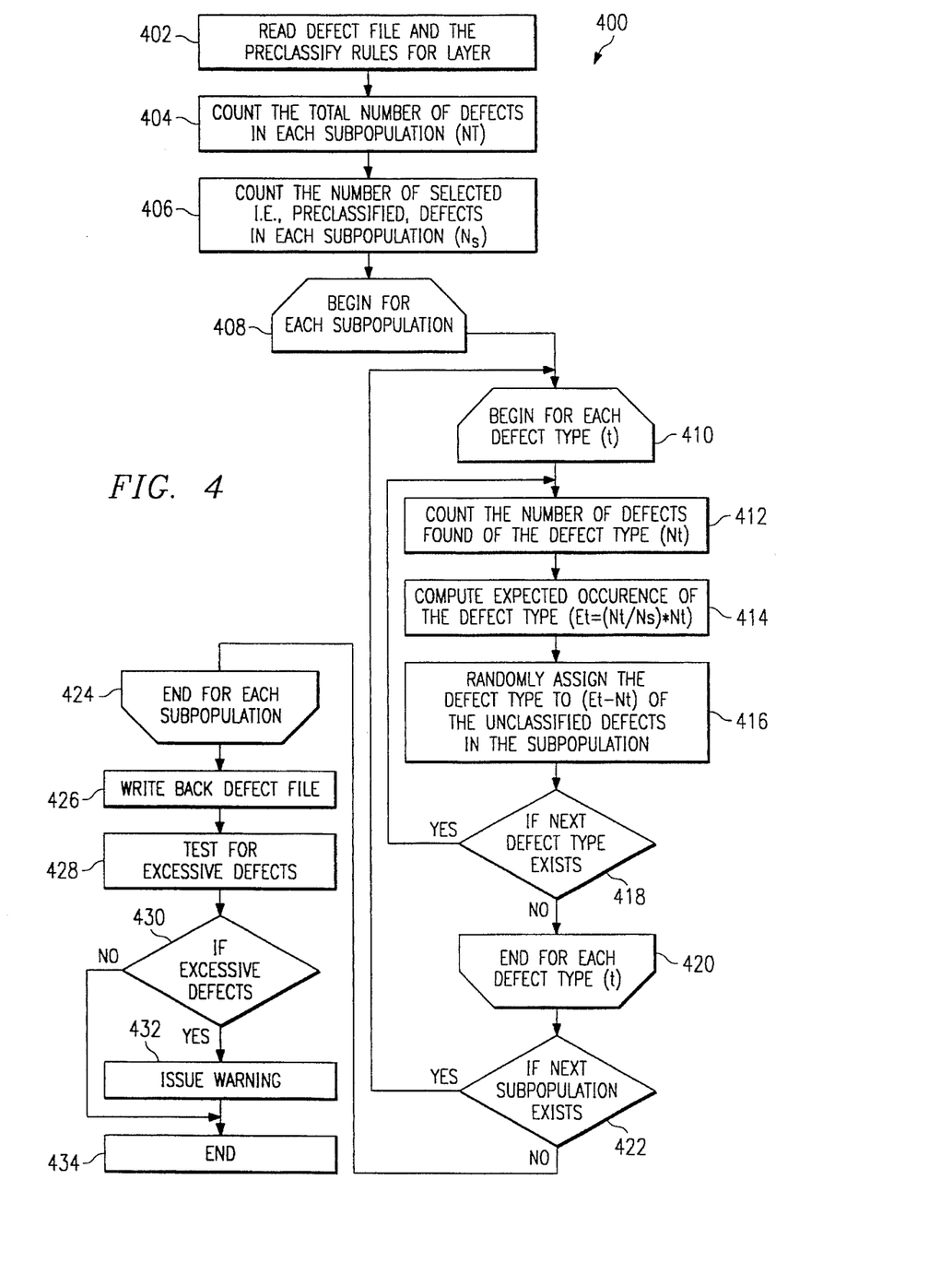
FIG. 4 is a process control flow diagram of the analysis program of the system of FIG. 1.

FIG. 4 is a process control flow diagram 400 of the analysis program 22. The defect extrapolation functions performed by the program 22 are run on a defect lot file such as the temporary file 56. The functions are specific to each production layer and are separately performed for all layers of interest.

In step 402 a defect file containing defect records for a fabrication layer of interest of a wafer lot is read into the computer 48 of the system 16. Similarly, an initialization file is read that contains preclassify rules, i.e., parameters, for the layer of interest. The preclassify rules are the same rules used for the layer in performing the preclassify function as described with reference to FIG. 3.

The remaining steps of the diagram 400 are best understood with reference to the extrapolation example of Table I set forth below.

TABLE I

Extrapolation Example

|  | Subpopulation A [0, 2] | Subpopulation B [2, 5] | Subpopulation C [5, *] |
|---|---|---|---|
| Number Defects Total ($N^T$) = 100 | $N_A^T = 50$ | $N_B^T = 40$ | $N_C^T = 10$ |
| Number Defects Selected ($N^S$) = 20 (Max = 20%) | $N_A^S = 8$ | $N_B^S = 7$ | $N_C^S = 7$ |

|  | # Found | # Expected | # Found | # Expected | # Found | # Expected |
|---|---|---|---|---|---|---|
| Defect Type 1 | $N_{At1} = 2$ | $E_{A1} = 12.5$ | $N_{Bt1} = 5$ | $E_{B1} = 28.5$ | $N_{Ct1} = 7$ | $E_{C1} = 10$ |
| Defect Type 2 | $N_{At2} = 4$ | $E_{A2} = 25$ | $N_{Bt2} = 2$ | $E_{B2} = 11.5$ | $N_{Ct2} = 2$ | $E_{C2} = 0$ |
| Defect Type 3 | $N_{At3} = 2$ | $E_{A3} = 12.5$ | $N_{Bt3} = 0$ | $E_{B3} = 0$ | $N_{Ct3} = 2$ | $E_{C3} = 0$ |
|  | $N_A^T = 50$ | | $N_B^T = 40$ | | $N_C^T = 10$ | |

In step 404 of FIG. 4, a count is made of the total number of defects ($N^T$) in each defect subpopulation defined by the preclassify rules. In the present example of Table I, there are three subpopulations A, B, and C that define defect size ranges of [0, 2], [2, 5], and [5, *], respectively. The total number of defects ($N^T$) counted in each of the subpopulations A, B, and C are indicated as $N^T_A=50$, $N^T_B=40$, and $N^T_C=10$, respectively. In step 406 a count is made of the number of selected, i.e., preclassified, defects in each subpopulation. In Table I the number of selected defects in each of the subpopulations A, B and C are $N^S_A=8$, $N^S_C=7$, and $N^S_C=7$, respectively.

In step 408 a processing loop begins that, as explained more fully below, is executed for each subpopulation and for each defect type (t) identified from the selected defects ($N^S$) in each subpopulation. The processing loop of steps 408–424 randomly assigns the classification codes for the defect types to unselected defects in the subpopulations so that the number of classified defects for each defect type in each subpopulation is approximately equal to the expected occurence for that defect type in that subpopulation. The result is that from the small sample of selected defects of different defect types in each subpopulation, the proper classification codes for all defects in the subpopulations are extrapolated and assigned, thereby representing the true number of defects of each defect type in each subpopulation.

In step 410 a processing loop begins for each defect type (t) in the subpopulation, as explained more fully below. It is understood the different defect types (t) for which the loop of steps 410–420 are applied were previously determined by review of the selected defects ($N^S$) by the operator 46. Specifically, as described previously with reference to FIG. 2, after the sample of defects were selected, i.e., preclassified, using the preclassify program 20, the selected defects were reviewed on the review station 42 and assigned the appropriate classification code for that defect type.

Table I, for example, illustrates three different defect types t1, t2, and t3 that were identified during such a manual review on the review station 42. In the example, 20 defects were selected ($N^S=20$) for review out of a total of 100 existing defects ($N^T=100$). When the defects to be reviewed are randomly selected according to the preclassify rules from the three subpopulations A, B and C, the defect types are found in different proportions in each of the subpopulations, thereby accurately reflecting the number of different defect types for different defect size ranges on the layer. For example, in subpopulation A (defects in a size range of 0 to 2 um), the number of selected defects of each type out of the 20 defects reviewed are $N_{At1}=2$, $N_{At2}=4$, and $N_{At3}=2$. It is understood that had the defects been chosen at random on the wafer without being chosen from different subpopulations, the relative proportions of defect types would likely be very different and less accurate.

Referring to the processing loop of steps 410–420, it is understood that execution begins with a first defect type (t) identified in a first subpopulation of the loop beginning at step 408. In step 412, a count is made of the number of defects found in the subpopulation of the defect type ($N_t$). In Table I, for example, the count of defects of type t1 in subpopulation A is equal to 2, i.e., $N_{At1}=2$. In step 414 the expected ocurrence of the defect type is computed. The expected occurence is an extrapolation from the number of defects actually found of the defect type ($N_t$), to a number of how many should be expected for that type in the entire subpopulation. The expected occurence ($E_t$) is determined by dividing the number of the defect type found ($N_t$) in the subpopulation by the number selected for review ($N^S$) in the subpopulation, and then multiplying that amount by the total number of defects ($N^T$) in the subpopulation (i.e., $E_t=(N_t/N^S)*N^T$). In Table I, the expected occurence for defect type t1 for subpopulation A is calculated as follows: $E_{At1}=((N_{At1}/N^S_A)*N^T_A)=((2/8)*50)=12.5$.

In step 416 the defect type is randomly assigned to unclassified defects in the subpopulation so that the total number of classified defects of the defect type in the subpopulation approximately equals the expected occurence ($E_t$) for that defect just calculated in step 414. Since the defects found in the subpopulation ($N_t$) already have been classified, this amount is subtracted from the expected occurence to equal the number of unclassified defects that need to be classified. Therefore, the number of unclassifed defects that needs to be randomly classified as defect type (t) is equal to $E_t - N_t$. In Table I, the number of defects to be randomly classified in subpopulation A is equal to $E_{At1} - N^T_A = 12.5 - 2 = 10.5$. Since 10.5 is not a whole number, but a statistical representation, the number actually classified will be rounded up or down.

In step 418 a determination is made whether a next defect type exists in the subpopulation. If so, execution returns to step 412 and the process loop is repeated. Otherwise execution proceeds to step 420 where the process loop begun in step 410 ends. In the example of Table I, it is understood the process loop of step 410 would be repeated for each of the three defect types t1, t2 and t3.

In step 422 a determination is made whether a next subpopulation exists and if so, execution returns to step 410. If no next subpopulation exists, execution proceeds to step 424 where the process loop begun in step 408 ends. In the example of Table I it is understood the process loop of step 408 would be repeated for each of the three subpopulations A, B, C.

As a result of the foregoing, the defect records of the layer defect file have been updated so that all of the defects have classification codes assigned to them. The classification codes were extrapolated, for each defect in each subpopulation, from the smaller number of sample defects originally reviewed and classified by the operator 46 at the review station 42. The extrapolated defect data represents the best estimation of defect types on the layer because the data takes into account samples of defects in different subpopulations of the layer, particularly different defect size ranges as determined by the original preclassify rules. Of course, other subpopulation criteria may be utilized, including subpopulations that define defect locations expressed as boxes, quadrants, radial zones or the like.

In step 426 the file with the extrapolated defect data is written back to a storage location, such as the scan database 38. In step 428 the extrapolated defect data is tested to determine if there are excessive defects on the layer, as dictated by certain predefined rules, discussed below. If there are excessive defects, in step 432 a warning is issued indicating the the existence of the excessive defects. The warning may appear as an audible and/or visual alert on the scan tool 14 or the system 16, such as on a computer display, for example. Execution ends in step 434 if in step 430 there are no excessive defects or following issuance of a warning in step 432.

One rule used to determine whether excessive defects exist relates to whether the number of die rendered inoperative, i.e., "killed," for a particular defect type exceeds a certain value. This rule may be expressed by the syntax "TypeNdie=X." Thus an excessive number of defects exists if the number of die killed by a particular defect type "N" exceeds X die. The value of X is chosen based upon historical trends as is typical with any statistical process control system. For example, the numbers may be set at three standard deviations above the mean number of defective die.

Another rule used to determine whether excessive defects exist relates to defect density. The rule may be expressed by the syntax "TypeNdensity=X." Thus an excessive number of defects exists for a certain defect type if the defect density exceeds X. As above, the value of the defect density X is chosen in a manner similar to that described above.

It is understood that in addition to issuing warnings upon detection of excessive defects, the extrapolated defect data may also be used to create a scan tool results file. Using commercially available scan tool software, the results file can display useful information pertaining to the extrapolated defect data, such as wafer maps, histograms, charts and the like.

It is understood that the present invention can take many forms and embodiments. The embodiments shown herein are intended to illustrate rather than to limit the invention, it being appreciated that variations may be made without departing from the spirit of the scope of the invention. For example, the preclassify and analysis programs may be organized into any number of different computer programs for operation on either or both of the system 16 and the tool 14. The computer of the system 16 may not be required if the same functions are implemented on the scan tool computer. The programs may be used to classify types of codes other than those mentioned in the preferred embodiment. The techniques of the present invention may also apply to analyses other than those of the preferred embodiment. The programs may be implemented in any appropriate programming language and run in cooperation with any computer system or scan tool. The review process described herein may be performed manually or by machine vision recognition of defect attributes.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A computer program for analyzing data associated with defects on a substrate, the program stored on a computer-readable medium, comprising:

instructions for selecting a subset of said defects from subpopulations of said defects according to preclassify rules, such that classification codes indicative of defect type may then be assigned to said selected defects based upon review thereof; and instructions for randomly assigning classification codes indicative of defect type to a number of unselected ones of said defects in each of said subpopulations, said number, for each defect type, being weighted according to the expected occurence of the defect type extrapolated from said selected defects of the same defect type.

2. The program of claim 1 further comprising:

instructions for, prior to said selecting, declustering said defect data to discard defects associated with the same defect clusters from said selection.

3. The program of claim i further comprising:

instructions for testing said code-assigned defects for excessive defects of specified defect type; and instructions for indicating the presence of said excessive defects.

4. The program of claim 3 wherein said substrate comprises multiple die, and wherein excessive defects of specified defect type exist when the number of die rendered inoperative by said specified defect type exceeds a predetermined number.

5. The program of claim 3 wherein excessive defects of specified defect type exist when the defect density of said specified defect type exceeds a predetermined number.

6. The program of claim 1 wherein said subpopulations are defined by defect size ranges.

7. The program of claim 1 wherein said subpopulations are defined by defect locations.

8. The program of claim 1 wherein said preclassify rules specify a maximum for said selected number.

9. The program of claim 1 wherein said preclassify rules specify a preclassify code to be assigned to said selected defects.

10. The program of claim 1 wherein said preclassify rules specify a randomization function for selecting defects in each of said subpopulations.

11. The program of claim 10 wherein said randomization function randomly selects any defect in said subpopulation.

12. The program of claim 10 wherein said substrate comprises multiple die and wherein said randomization function randomly selects a die from amongst all die that have a defect or defects that are in said subpopulation, and then randomly selects a defect from within said randomly selected die.

13. The program of claim 1 wherein said expected occurrence (E) is determined, for each defect type, by the equation $E_i=(N_i/N^S)*N^T$, where $N_i$ is the number of said selected defects in said subpopulation of said defect type, $N^S$ is the total number of said selected defects in said subpopulation, and $N^T$ is the total number of said defects in said subpopulation.

14. The program of claim 13 wherein said number of defect classification codes randomly assigned to said unclassified defects in each subpopulation, for each defect type, is equal to said expected occurence of said defect type for said subpopulation minus the number of selected defects of said defect type in said subpopulation.

15. A method for analyzing data associated with defects on a substrate, the method comprising:

selecting a subset of said defects from subpopulations of said defects according to preclassify rules;

assigning classification codes indicative of defect type to said selected defects based upon review thereof; and randomly assigning classification codes indicative of defect type to a number of unselected ones of said defects in each of said subpopulations, said number, for each defect type, being weighted according to the expected occurence of the defect type extrapolated from said selected defects of the same defect type.

16. The method of claim 15 further comprising:

prior to said selecting, declustering said defect data to discard defects associated with the same defect clusters from said selection.

17. The method of claim 15 further comprising:

testing said code-assigned defects for excessive defects of specified defect type; and indicating the presence of said excessive defects.

18. The method of claim 17 wherein said substrate comprises multiple die, and wherein excessive defects of specified defect type exist when the number of die rendered inoperative by said specified defect type exceeds a predetermined number.

19. The method of claim 17 wherein excessive defects of specified defect type exist when the defect density of said specified defect type exceeds a predetermined number.

20. The method of claim 15 wherein said subpopulations are defined by defect size ranges.

21. The method of claim 15 wherein said subpopulations are defined by defect locations.

22. The method of claim 15 wherein said review is performed manually on a review station.

23. The method of claim 15 wherein said preclassify rules specify a maximum for said selected number.

24. The method of claim 15 wherein said pre classify rules specify a preclassify code to be assigned to said selected defects.

25. The method of claim 15 wherein said preclassify rules specify a randomization function for selecting defects in each of said subpopulations.

26. The method of claim 25 wherein said randomization function randomly selects any defect in said subpopulation.

27. The method of claim 25 wherein said substrate comprises multiple die and wherein said randomization function randomly selects a die from amongst all die that have a defect or defects that are in said subpopulation, and then randomly selects a defect from within said randomly selected die.

28. The method of claim 15 wherein said expected occurrence (E) is determined, for each defect type, by the equation $E_i=(N_i/N_S)*N^T$, where $N_i$ is the number of said selected defects in said subpopulation of said defect type, $N^S$ is the total number of said selected defects in said subpopulation, and $N^T$ is the total number of said defects in said subpopulation.

29. The method of claim 28 wherein said number of defect classification codes randomly assigned to said unclassified defects in each subpopulation, for each defect type, is equal to said expected occurence of said defect type for said subpopulation minus the number of selected defects of said defect type in said subpopulation.

30. A method for analyzing data associated with defects on a substrate, the method comprising:

selecting a subset of said defects from subpopulations of said defects according to preclassify rules, said preclassify rules specifying a maximum for said number of said defects to be selected;

assigning classification codes indicative of defect type to said selected defects based upon a review thereof;

randomly assigning classification codes indicative of defect type to a number of unselected ones of said defects in each of said subpopulations, said number, for each defect type, being weighted according to the expected occurence of the defect type extrapolated from said selected defects of the same defect type;

testing said code-assigned defects for excessive defects of specified defect type; and indicating the presence of said excessive defects.

31. The method of claim 30 wherein said substrate comprises multiple die, and wherein excessive defects of specified defect type exist when the number of die rendered inoperative by said specified defect type exceeds a predetermined number.

32. The method of claim 30 wherein excessive defects of specified defect type exist when the defect density of said specified defect type exceeds a predetermined number.

33. The method of claim 30 wherein said substrate comprises multiple die, and wherein said random assignment is made according to a randomization function in which a die is first selected from amongst all die that have a defect or defects that are in said subpopulation, and then a defect is randomly selected from within said randomly selected die.

34. The method of claim 30 wherein said subpopulations are defined by defect size ranges.

35. The method of claim 30 wherein said subpopulations are defined by defect locations.

36. The method of claim 30 wherein said review is performed manually on a review station.

37. The method of claim 30 wherein said expected occurrence is determined, for each defect type, by the equation $E_i=(N_i/N^S)*N^T$, where $E_i$ is the expected occurence for said defect type, $N_i$ is the number of said selected defects in said subpopulation of said defect type, $N^S$ is the total number of said selected defects in said subpopulation., and $N^T$ is the total number of said defects in said subpopulation.

38. The method of claim 37 wherein said number of defect classification codes randomly assigned to said unclassified defects in each subpopulation, for each defect type, is equal to said expected occurence of said defect type for said subpopulation minus the number of selected defects of said defect type in said subpopulation.

\* \* \* \* \*

UNITED STATES PATENT AND TRADEMARK OFFICE
CERTIFICATE OF CORRECTION

PATENT NO. : 5,539,752
DATED : July 23, 1996
INVENTOR(S) : Alan Berezin et al.

It is certified that error appears in the above-indentified patent and that said Letters Patent is hereby corrected as shown below:

Col. 10, line 38, "200" should be --20--.

Col. 11, lines 29 and 30, "$N^S_A=8$, $N^S_B=7$, and $N^S_C=7$," should be --$N^S_A=8$, $N^S_B=7$, and $N^S_C=7$,
Col. 14,
In Claim 3, line 1, "i" should be --1--.
Col. 15,
In Claim 13, line 1, "I" should be --1--.

Signed and Sealed this

Eleventh Day of February, 1997

Attest:

BRUCE LEHMAN

Attesting Officer          Commissioner of Patents and Trademarks